US011121316B2

(12) United States Patent
Cohen et al.

(10) Patent No.: US 11,121,316 B2
(45) Date of Patent: Sep. 14, 2021

(54) SYMMETRIC TUNABLE PCM RESISTOR FOR ARTIFICIAL INTELLIGENCE CIRCUITS

(71) Applicant: International Business Machines Corporation, Armonk, NY (US)

(72) Inventors: Guy M. Cohen, Westchester, NY (US); Paul M. Solomon, Westchester, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/749,042

(22) Filed: Jan. 22, 2020

(65) Prior Publication Data

US 2020/0161545 A1     May 21, 2020

Related U.S. Application Data

(63) Continuation of application No. 16/106,984, filed on Aug. 21, 2018, now Pat. No. 10,586,922.

(51) Int. Cl.
*G11C 11/00* (2006.01)
*H01L 45/00* (2006.01)
*G11C 13/00* (2006.01)

(52) U.S. Cl.
CPC ........ *H01L 45/126* (2013.01); *G11C 13/0004* (2013.01); *H01L 45/06* (2013.01); *H01L 45/1233* (2013.01); *H01L 45/144* (2013.01); *H01L 45/16* (2013.01)

(58) Field of Classification Search
CPC .................................................. G11C 13/0004
USPC ......................................................... 365/163
See application file for complete search history.

(56) References Cited

U.S. PATENT DOCUMENTS

| 5,912,839 A | 6/1999 | Ovshinsky et al. |
| 9,672,906 B2 | 6/2017 | Lung et al. |
| 9,882,126 B2 | 1/2018 | Brightsky et al. |
| 10,586,922 B1 * | 3/2020 | Cohen ................. H01L 45/1683 |
| 2004/0251988 A1 | 12/2004 | Sharma et al. |
| 2008/0283817 A1 | 11/2008 | Yu et al. |
| 2010/0097842 A1 | 4/2010 | Hwang |
| 2012/0057402 A1 * | 3/2012 | Kim ................... G11C 13/0069 365/163 |

(Continued)

FOREIGN PATENT DOCUMENTS

| WO | 9967790 | 12/1999 |
| WO | 2014108215 A1 | 7/2014 |

OTHER PUBLICATIONS

Cohen et al., "Symmetric Tunable PCM Resistor for Artificial Intelligence Circuits," U.S. Appl. No. 16/106,984, filed Aug. 21, 2018.

(Continued)

*Primary Examiner* — Hoai V Ho
(74) *Attorney, Agent, or Firm* — Cantor Colburn LLP; Randall Bluestone

(57) ABSTRACT

A method of tuning a PCM device is disclosed. The method includes receiving a command and determining if the command is a SET command or a RESET command. When the command is a RESET command, the method provides a short pulse across a resistive electrode and a top electrode through a phase change material generating amorphous PCM at the point of highest voltage across the PCM region.

12 Claims, 15 Drawing Sheets

(56) References Cited

U.S. PATENT DOCUMENTS

2015/0381181 A1* 12/2015 Miao ................. G11C 13/0004
                                                          326/38
2016/0372188 A1   12/2016 Lung et al.
2017/0124025 A1    5/2017 Gokmen
2017/0294578 A1   10/2017 Brightsky et al.
2019/0189237 A1*  6/2019 Majumdar ....... G11C 29/50004

OTHER PUBLICATIONS

Gokmen et al.; "Acceleration of Deep Neural Network Training with Resistive Cross-Point Devices"; Front. Neurosci 10, 333 (2016); 19 pages.

List of IBM Patents or Patent Applications Treated As Related; Date Filed: Jan. 22, 2020, 2 pages.

Tomer et al.; "A Phase Change Material for Reconfigurable Circuit Applications"; Applied Sciences, 8, 130, doi:10.3390/app8010130 (2018); 8 pages.

Tuma et al.; "Stochastic phase-change neurons"; Nature Nanotechnology, vol. 11, Aug. 2016; 8 pages.

* cited by examiner

SYMMETRIC TUNABLE PCM RESISTOR FOR ARTIFICIAL INTELLIGENCE CIRCUITS

DOMESTIC PRIORITY

This application is a continuation of U.S. patent application Ser. No. 16/106,984, filed Aug. 21, 2018, the disclosure of which is incorporated by reference herein in its entirety.

BACKGROUND

The present invention relates in general to phase change materials and more specifically, to a tunable phase change resistor for use in artificial intelligence circuits.

Devices based on phase change materials ("PCM") are being explored to implement and accelerate artificial intelligence ("AI") computing circuits. The computation is based on changing the PCM element gradually from a high resistance state, which is the amorphous phase, to a lower resistant state, which is the crystalline phase. The PCM device can be used as an analog resistor, where the value of stored data is represented by a continuously variable resistance, rather than a two state, or digital, value of high or low resistance.

SUMMARY

Embodiments of the present invention are directed to a method of tuning a PCM device. The method includes receiving a command and determining if the command is a SET command or a RESET command. When the command is a RESET command, the method provides a short pulse across a resistive electrode and a top electrode through a phase change material generating amorphous PCM at the point of highest voltage across the PCM region.

Additional embodiments of the present invention are directed to a method of tuning a PCM device. The method includes receiving a command and determining if the command is a SET command or a RESET command. When the command is a SET command, the method provides a long pulse across a resistive electrode and a top electrode through a phase change material.

Additional embodiments of the present invention are directed to a method of tuning a PCM device. The method includes receiving a command and determining if the command is a SET command or a RESET command. When the command is a RESET command, the method provides a short pulse across a resistive electrode and a top electrode through a phase change material generating amorphous PCM at the point of highest voltage across the PCM region. The short pulse is provided to the resistive electrode via a via beneath one side of the resistive electrode

DETAILED DESCRIPTION

Figure 1:
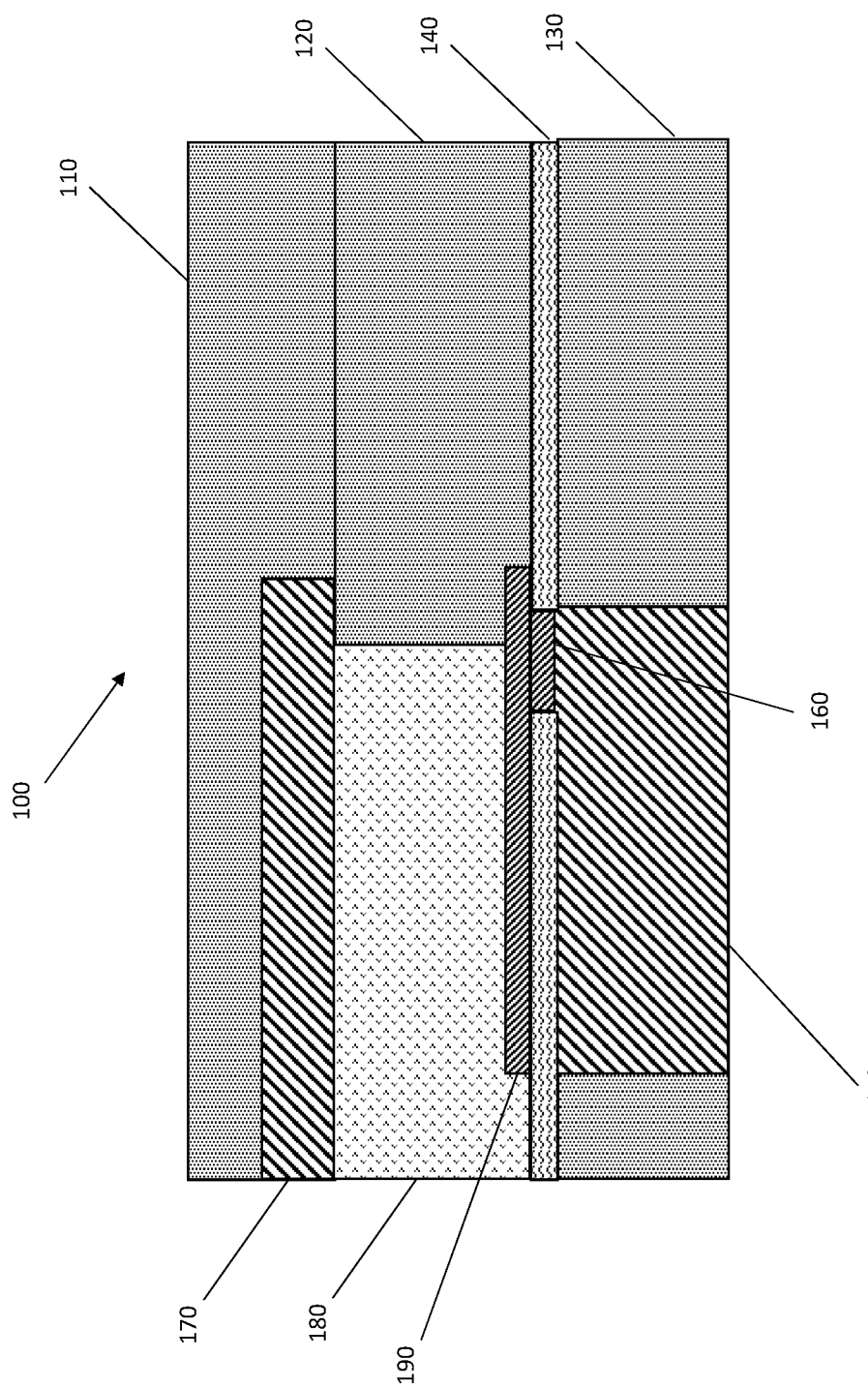
FIG. 1 is a cross-section of an exemplary PCM device according to embodiments of the invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

PCM material takes advantage of the large resistance contrast between the amorphous and crystalline states. The amorphous phase has high electrical resistivity, and the crystalline phase has a low resistivity. Oftentimes the difference in resistivity is three to four orders of magnitude. Thus, the change in read current is very large which provides for an opportunity for multiple analog levels that are needed for multi-level cell technology operations.

As previously noted herein, a PCM device can be used as an analog resistor, where the value of stored data is represented by a continuously variable resistance, rather than a two state, or digital, value of high or low resistance. PCM devices tend to be used in an array with an access device controlling SET, RESET, and READ of the PCM device. Using a series of short SET pulses it is possible to gradually increase the conductance of the PCM resistor. However, decreasing the device conductance gradually using a series of RESET pulses is challenging. For example, in a mushroom PCM device one can get various sizes (depths) of the amorphous PCM (a-PCM) region by changing the amplitude of the RESET pulse. However, in all cases the -PCM region will fully cover the bottom electrode, so in practice since the electrode is fully covered a maximum resistance is reached regardless of the a-PCM region depth. It is hard to obtain a partial coverage of the bottom electrode with a-PCM material since the device is symmetric. Embodiments of the present invention introduce an asymmetry as will be explained below. This asymmetry enables achievement of a gradual progression of -PCM coverage of the bottom electrode using multiple RESET pulses.

Embodiments of the invention provide a resistive processing unit (RPU) in the form of a PCM resistor. In embodiments of the invention, the PCM resistor is configured and arranged to allow the formation of an amorphous material over a bottom electrode in a progressive manner. Suitable materials for a PCM in accordance with embodiments of the invention include, for example, $Ge_2Sb_2Te_5$, GeTe, $Sb_2Te_3$, (or GST as a name for the family of phase change materials which include two or more of the elements Ge, Sb, and Te.). Each RESET pulse leads to an additional area of the bottom electrode covered with an amorphous PCM.

In order to SET the PCM into a low-resistance state, an electrical pulse is applied to heat the cell above the crystallization temperature of the PCM. For the RESET operation, a larger electrical current is applied in order to melt a portion of the PCM. If this pulse is abruptly cut off, the molten material quenches into the amorphous state producing high resistance in the PCM.

RESET pulses are short pulses that are only tens of nanoseconds in length, for example, about 20, 30, or 40 nanoseconds. The exact length of time varies depending upon the material used in the PCM and the geometry of a PCM region. For example, $Ge_2Sb_2Te_5$ would generally be used with a 30 nanosecond pulse. These short pulses cause melting and quenching to yield amorphous PCM. SET pulses cause a change from high resistance to lower resistance through current pulses that cause the PCM to crystalize. Long pulses are provided as SET pulses to provide low current annealing. In embodiments of the invention, long SET pulses can be about one hundred nanoseconds in length for $Ge_2Sb_2Te_5$ in order to crystalize the PCM.

FIG. 1 is a cross-section of an exemplary PCM device 100 according to embodiments of the invention. The cross-section is taken along the wider dimension of the bottom electrode 150. This cross-section is rotated by 90 degrees with respect to the conventional cross-section of PCM cells, where the bottom electrode narrow dimension is captured. The bottom electrode 150 is covered with a thin insulator layer 140. An opening or via 160 is made in the thin insulator layer 140 to expose the end of the bottom electrode 150. The bottom electrode 150 is an equipotential electrode. A resistive electrode 190, which is resistive and therefore not equipotential, is deposited and patterned over the thin insulator layer 140 and the via 160. The resistive electrode 190 can be made of, for example, tantalum nitride or carbon.

The resistive electrode 190 forms a contact with the bottom electrode 150 through the via 160. A PCM region 180, for example, GeTe, $Sb_2Te_3$, GaSb, GeSbTe, $Ge_2Sb_2Te_5$ or GST, is deposited over the resistive electrode 190. The PCM region 180 can be patterned by reactive ion etching or chemical mechanical polishing, for example. A top electrode 170 is formed over the PCM region 180. The top electrode 170, like the bottom electrode 150, is an equipotential electrode. Oxide or nitride materials 110, 120, and 130 are placed within and around the other layers 170, 140, 190. Unlike conventional mushroom PCM cells, resistive electrode 190 is not equipotential and therefore there is a voltage drop along the resistive electrode 190. Conventional mushroom PCM cells have a bottom electrode that is not resistive, but rather is equipotential.

Figure 2:
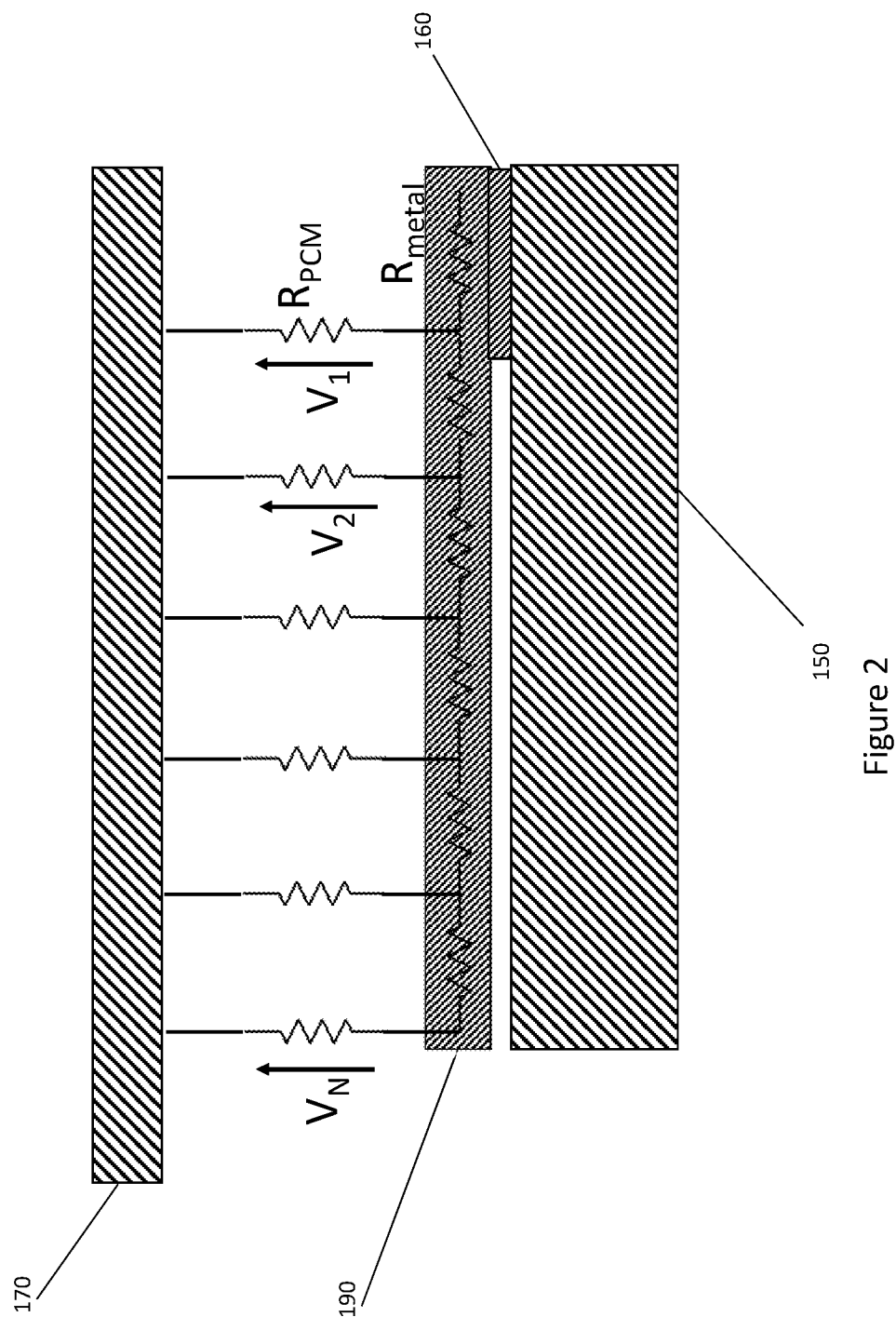
FIG. 2 illustrates the effect of having a resistive electrode as a lower electrode showing an equivalent circuit according to embodiments of the invention.

FIG. 2 illustrates the effect of having a resistive electrode 190 as a lower electrode showing an equivalent circuit according to embodiments of the invention. The voltage drop between the resistive electrode 190 and the top electrode 170 varies from left to right as represented by the series of resistors labeled $R_{metal}$. $R_{PCM}$ represents the resistance through the PCM region 180 from the top electrode 170 to the resistive electrode 190 as you move from right to left across the PCM region 180. At the right side, where the resistive electrode 190 is in contact with the bottom electrode 150 through via 160, voltage $V_1$ is the largest. As you move to the left the voltage drops such that $V_1 > V_2 > V_N$.

Figure 3A:
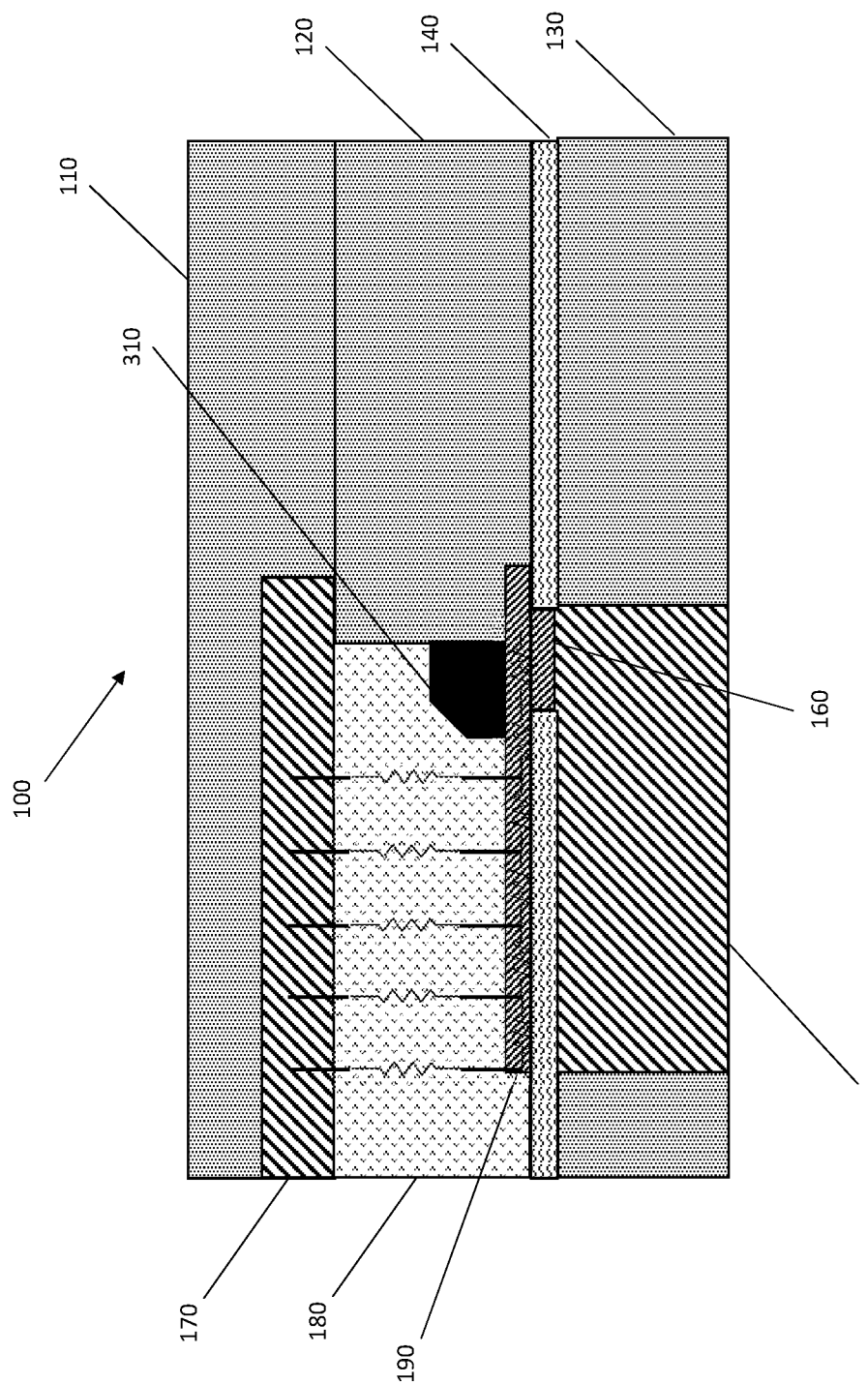
FIGS. 3a, 3b, and 3c illustrate the operation of RESET pulses on the PCM according to embodiments of the invention.
Figure 3B:
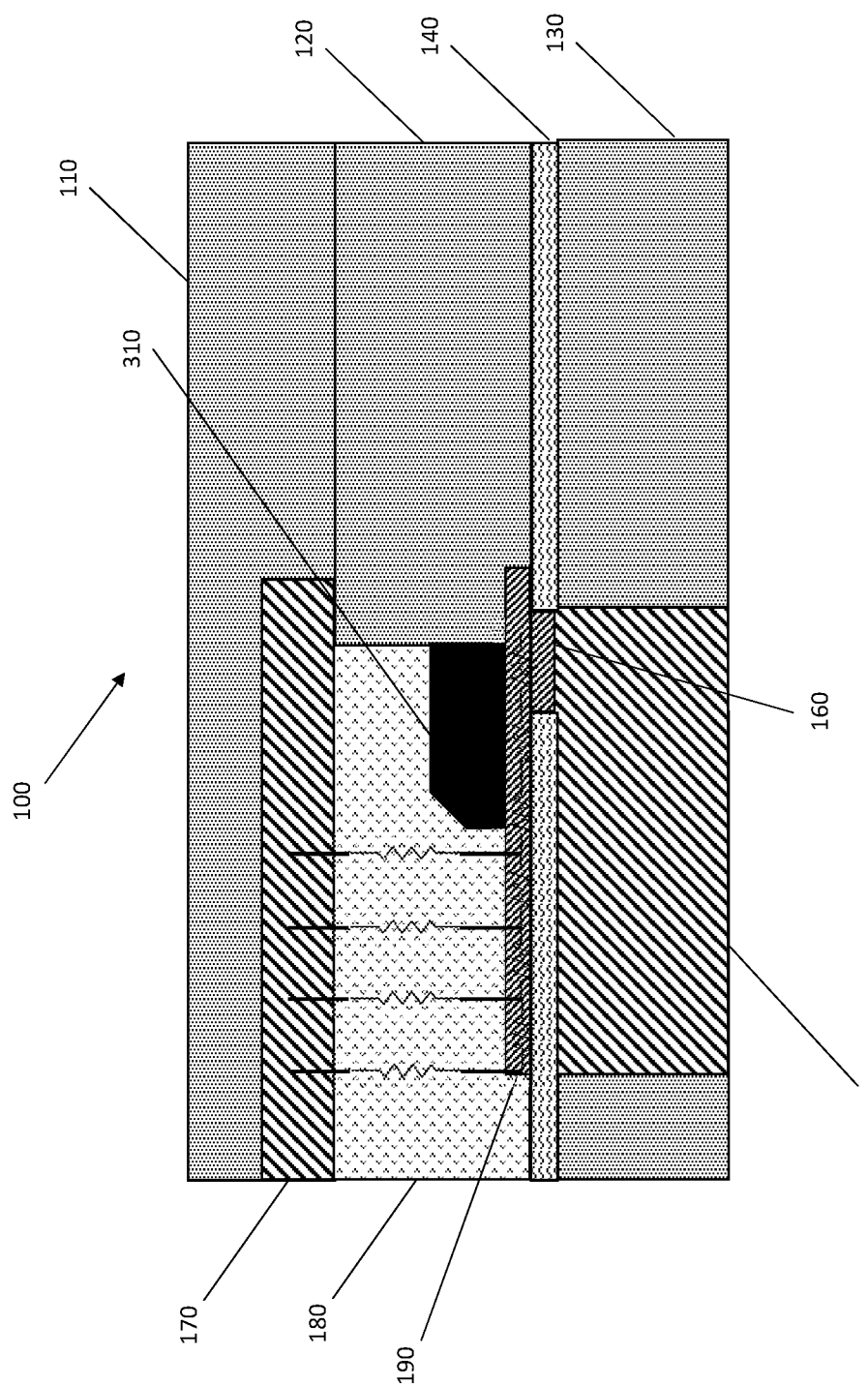
Figure 3C:
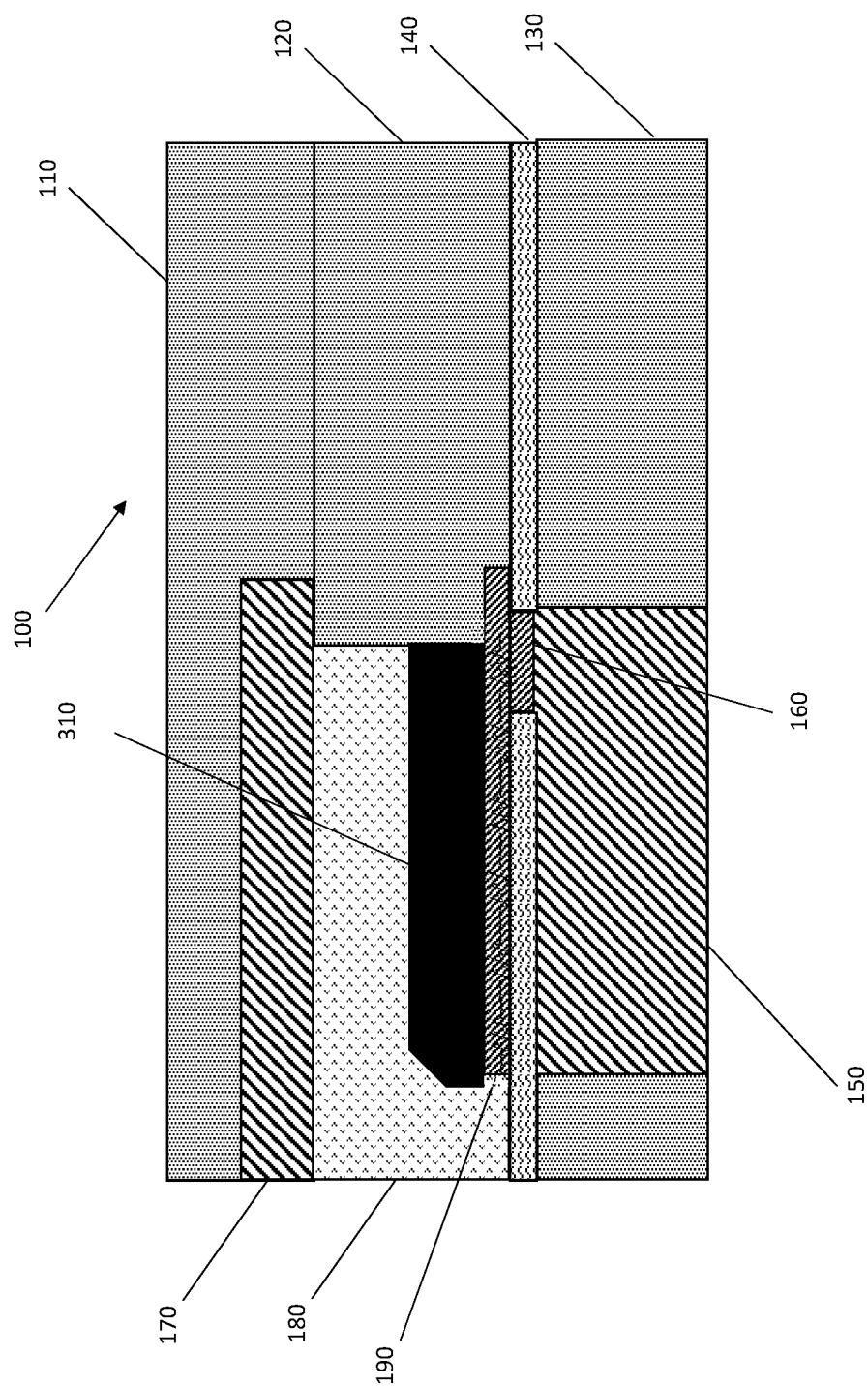

FIGS. 3a, 3b, and 3c illustrate the operation of RESET pulses on the PCM in an embodiment according to embodiments of the invention. FIG. 3a illustrates what happens when a short RESET pulse is applied to the PCM region 180. The PCM region 180 is initially shown in its crystalline state. Upon applying a short RESET pulse, an amorphous material 310 is formed at the location of the highest voltage, initially $V_1$. FIG. 3b illustrates what happens when a second RESET pulse is applied. After applying the second RESET pulse, more amorphous material 310 forms adjacent to the material formed from the first RESET pulse. FIG. 3c illustrates the additional amorphous material 310 formed after N RESET pulses until the entire resistive electrode 190 is covered in amorphous material 310.

The resistance of the PCM device 100 is controlled by the area of the resistive electrode 190 that is in contact with crystalline PCM. As such, each RESET pulse will decrease the area in contact with crystalline PCM 180, leading to higher resistance or lower conductance.

Figure 4:
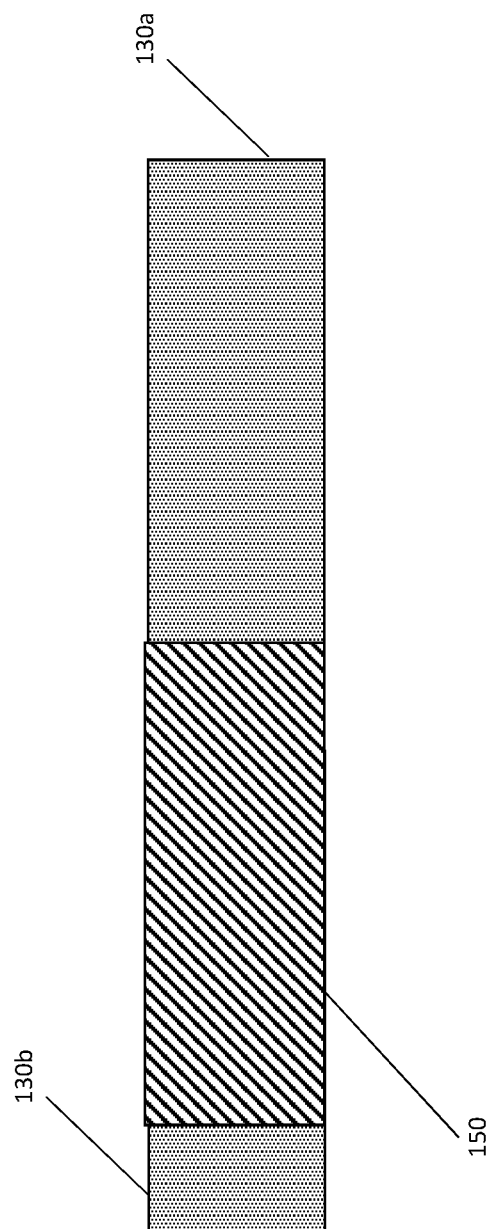
FIG. 4 illustrates a first stage of creating the PCM according to embodiments of the invention.

FIG. 4 illustrates a first stage of creating the PCM device according to embodiments of the invention. An oxide layer 130a, 130b is formed upon a silicon wafer (not shown). A trench is etched into the oxide layer 130a, 130b and filled, by sputtering or CVD, for example, with a metal forming a bottom electrode 150, typically tungsten or titanium nitride. The metal layer 150 is polished back using chemical mechanical processing ("CMP").

Figure 5:
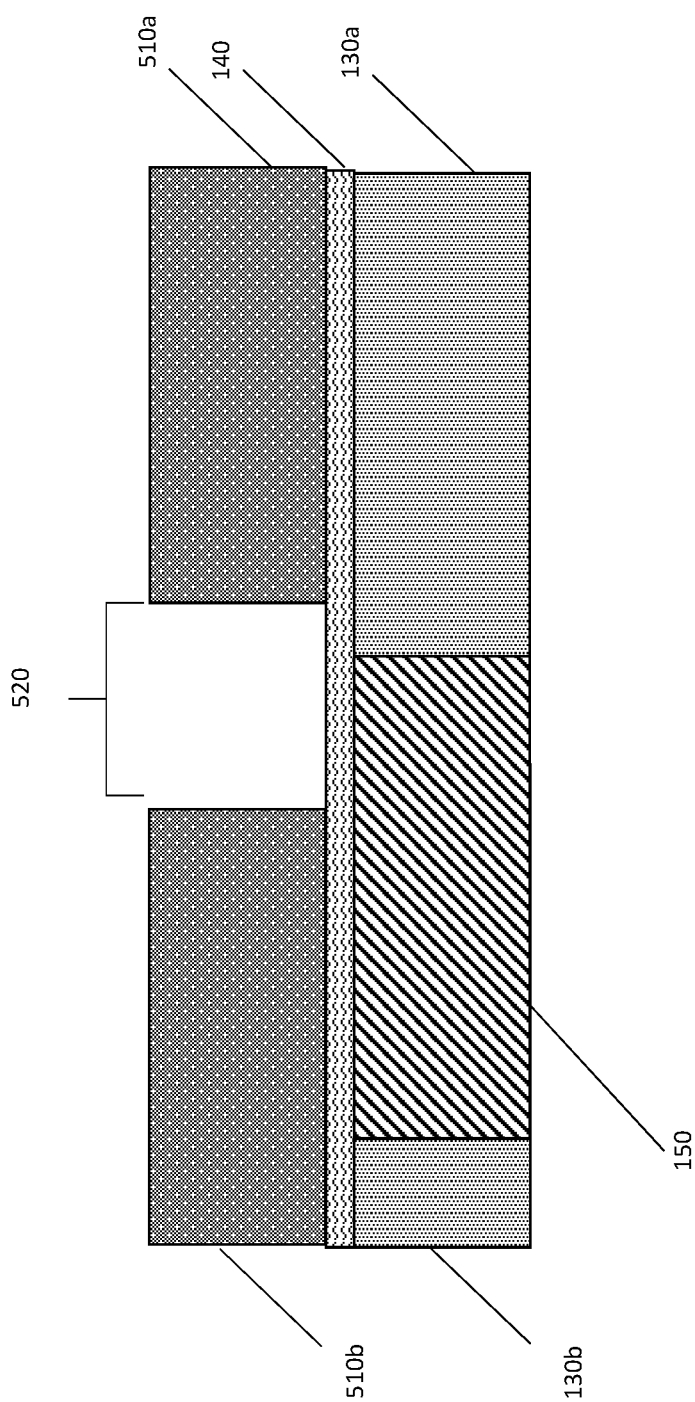
FIG. 5 illustrates a second stage of creating the PCM according to embodiments of the invention.

FIG. 5 illustrates a second stage of creating the PCM device according to embodiments of the invention. An insulator layer 140 is deposited on top of the oxide 130a, 130b and the metal that forms the bottom electrode 150. The insulator layer 140 can be deposited by, for example, CVD or ALD. A layer of sacrificial material 510a, 510b is deposited on top of the insulator layer 140. An opening 520 is creating by patterning sacrificial material 510a, 510b using lithography and reactive ion etching (RIE).

Figure 6:
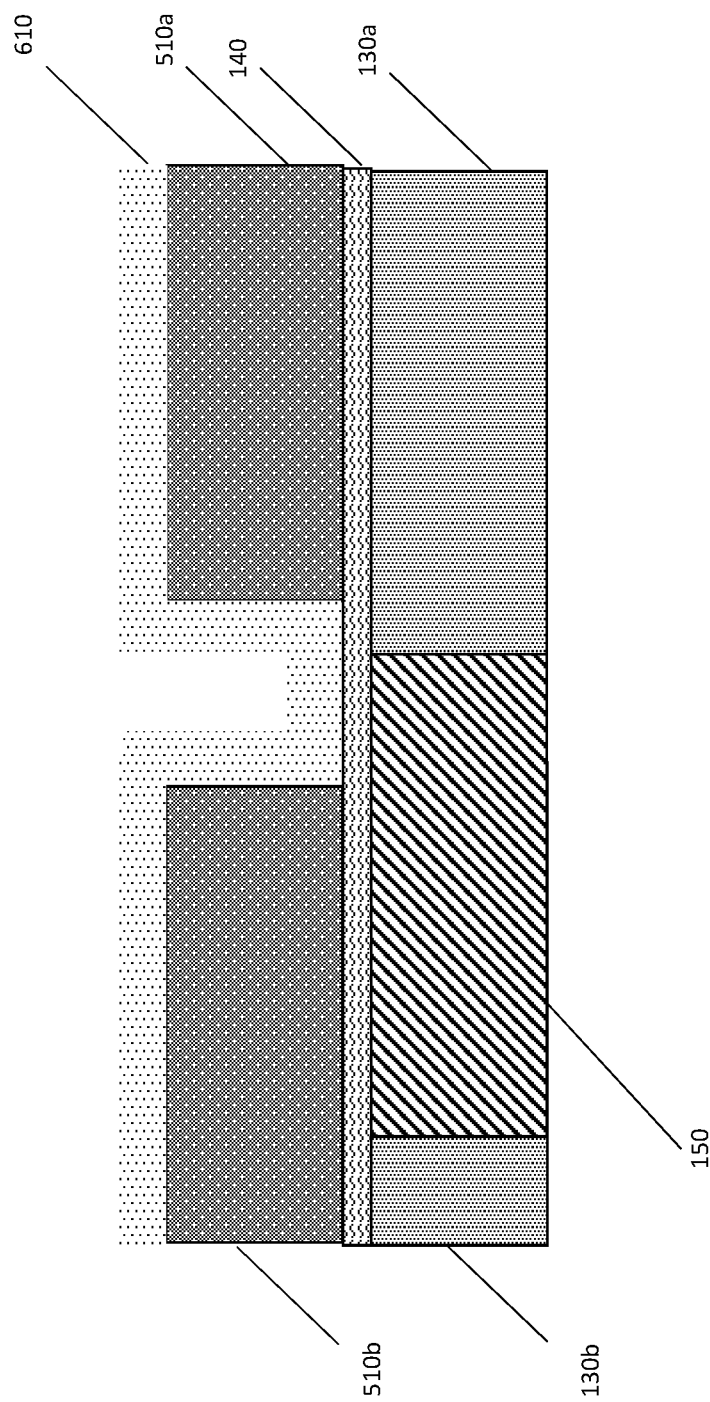
FIG. 6 illustrates a third stage of creating the PCM according to embodiments of the invention.

FIG. 6 illustrates a third stage of creating the PCM according to embodiments of the invention. A second, conformal, sacrificial layer 610 is deposited on to of sacrificial material 510a, 510b using ALD or CVD. The second, conformal, sacrificial layer 610 can be nitride, for example.

Figure 7:
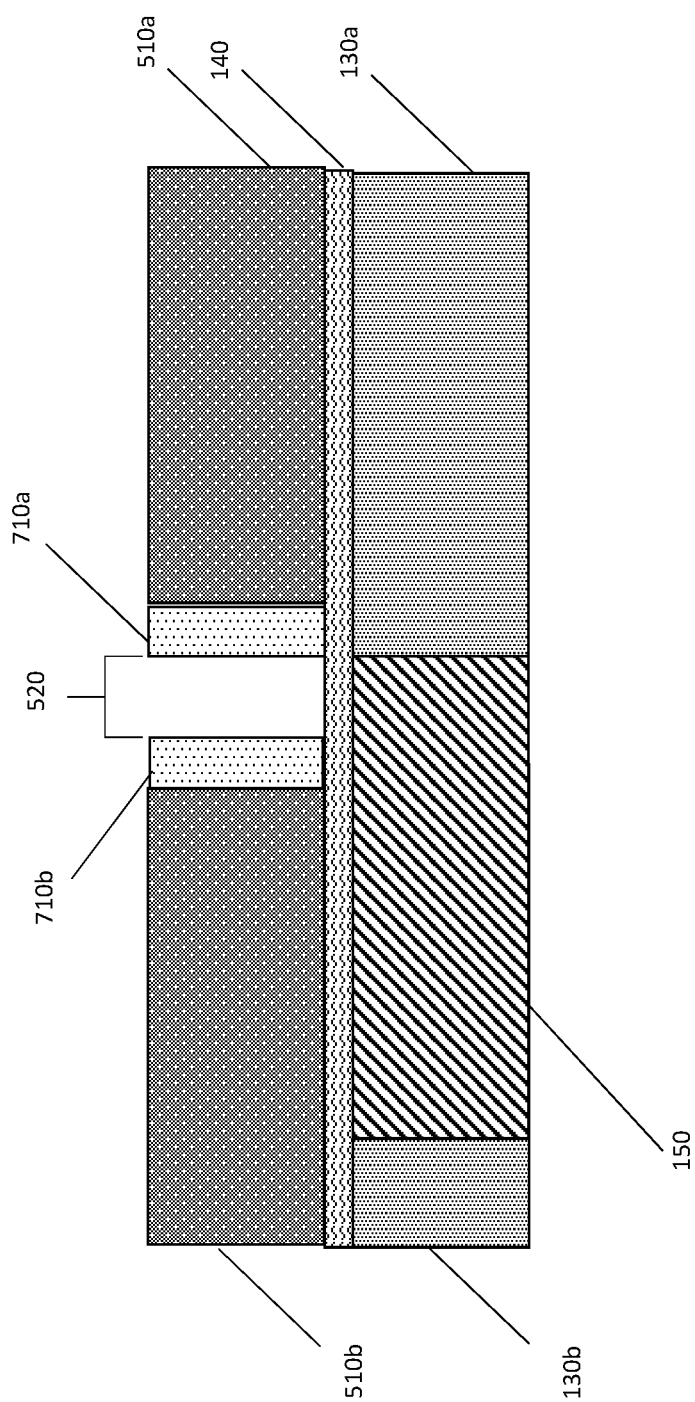
FIG. 7 illustrates a fourth stage of creating the PCM according to embodiments of the invention.

FIG. 7 illustrates a fourth stage of creating the PCM device according to embodiments of the invention. Using RIE, the second, conformal, sacrificial layer 610 is etched back to form spacers 710a, 710b in order to narrow the opening 520. Spacers 710a, 710b are formed due to the directional etching nature of RIE leaving layer 610 as side walls where there is a step following an etch. Through the process in FIGS. 6 and 7 an opening can be created that is smaller than could otherwise be created by the minimum feature size of the lithography.

Figure 8:
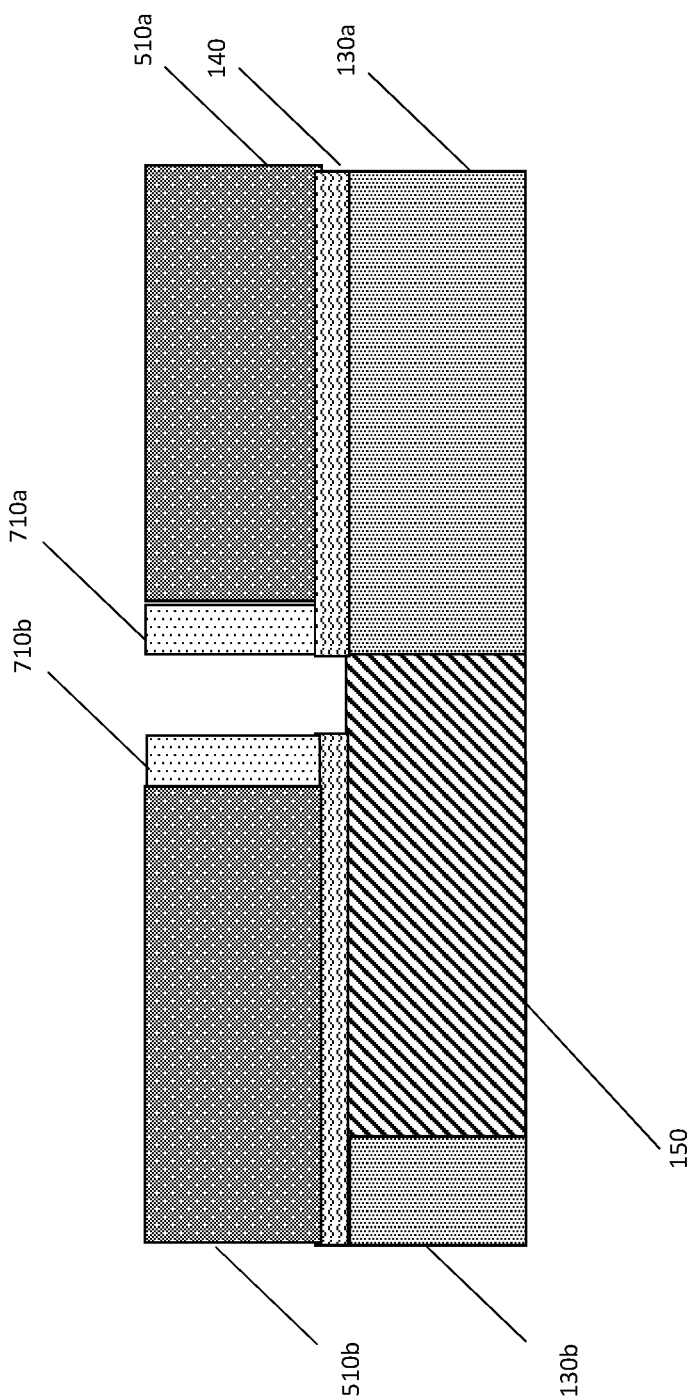
FIG. 8 illustrates a fifth stage of creating the PCM according to embodiments of the invention.

FIG. 8 illustrates a fifth stage of creating the PCM device according to embodiments of the invention. Again using RIE, the insulator layer 140 is etched back exposing the bottom electrode 150.

Figure 9:
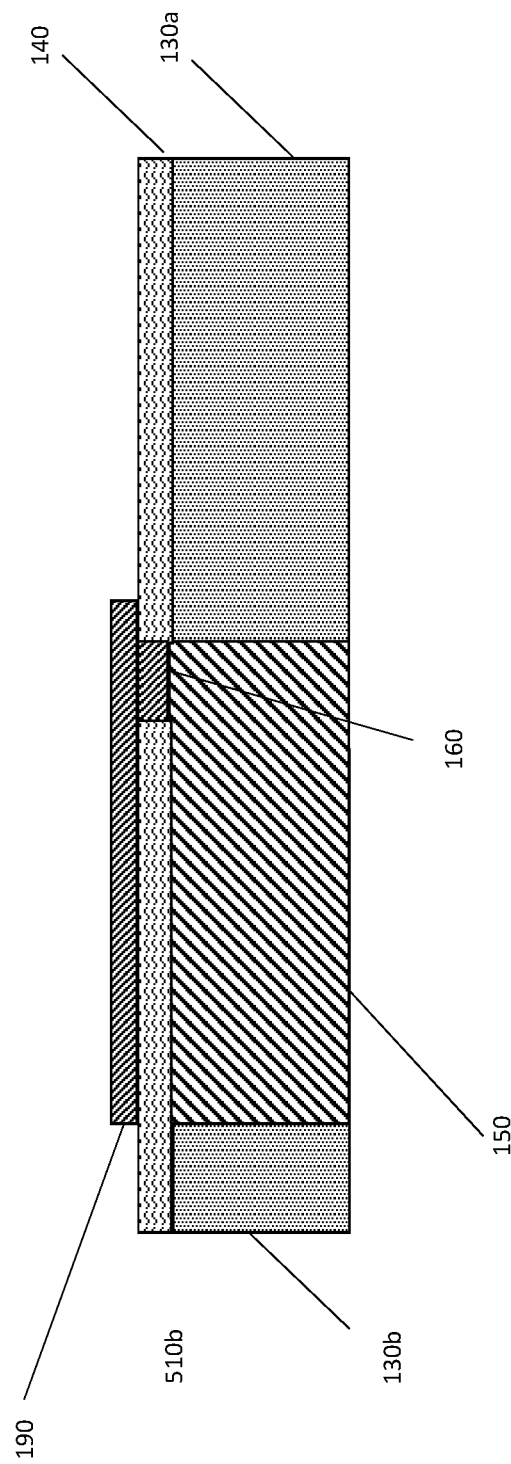
FIG. 9 illustrates a sixth stage of creating the PCM according to embodiments of the invention.

FIG. 9 illustrates a sixth stage of creating the PCM device according to embodiments of the invention. First, the sacrificial layer 510a, 510b is removed, along with the spacers 710a, 710b. Then, a resistive electrode 190 and via 160 are deposited and patterned.

Figure 10:
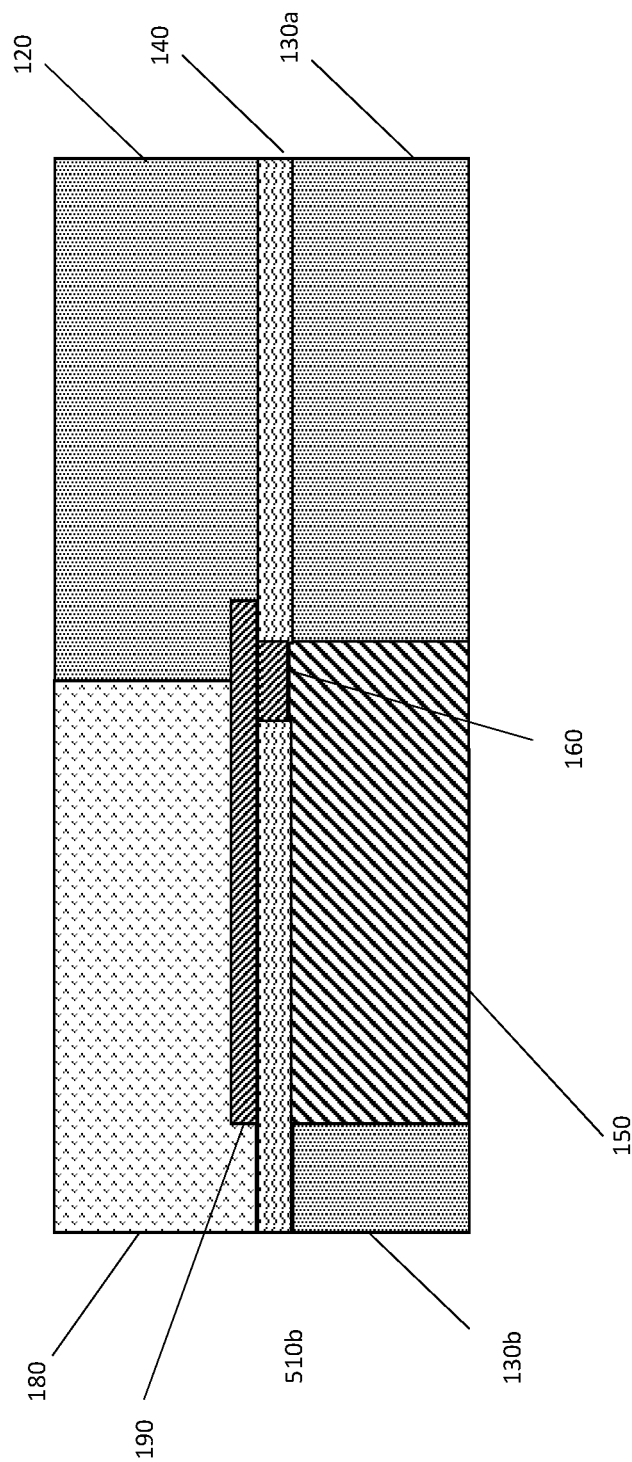
FIG. 10 illustrates a seventh stage of creating the PCM according to embodiments of the invention.

FIG. 10 illustrates a seventh stage of creating the PCM device according to embodiments of the invention. An insulator 120 is deposited next upon the insulator layer 140 and resistive electrode 190. A trench is patterned in the insulator 120 and PCM 180 deposited in the trench. Next, the PCM 180 and insulator 120 are polished back by CMP to define the PCM region 180.

Figure 11:
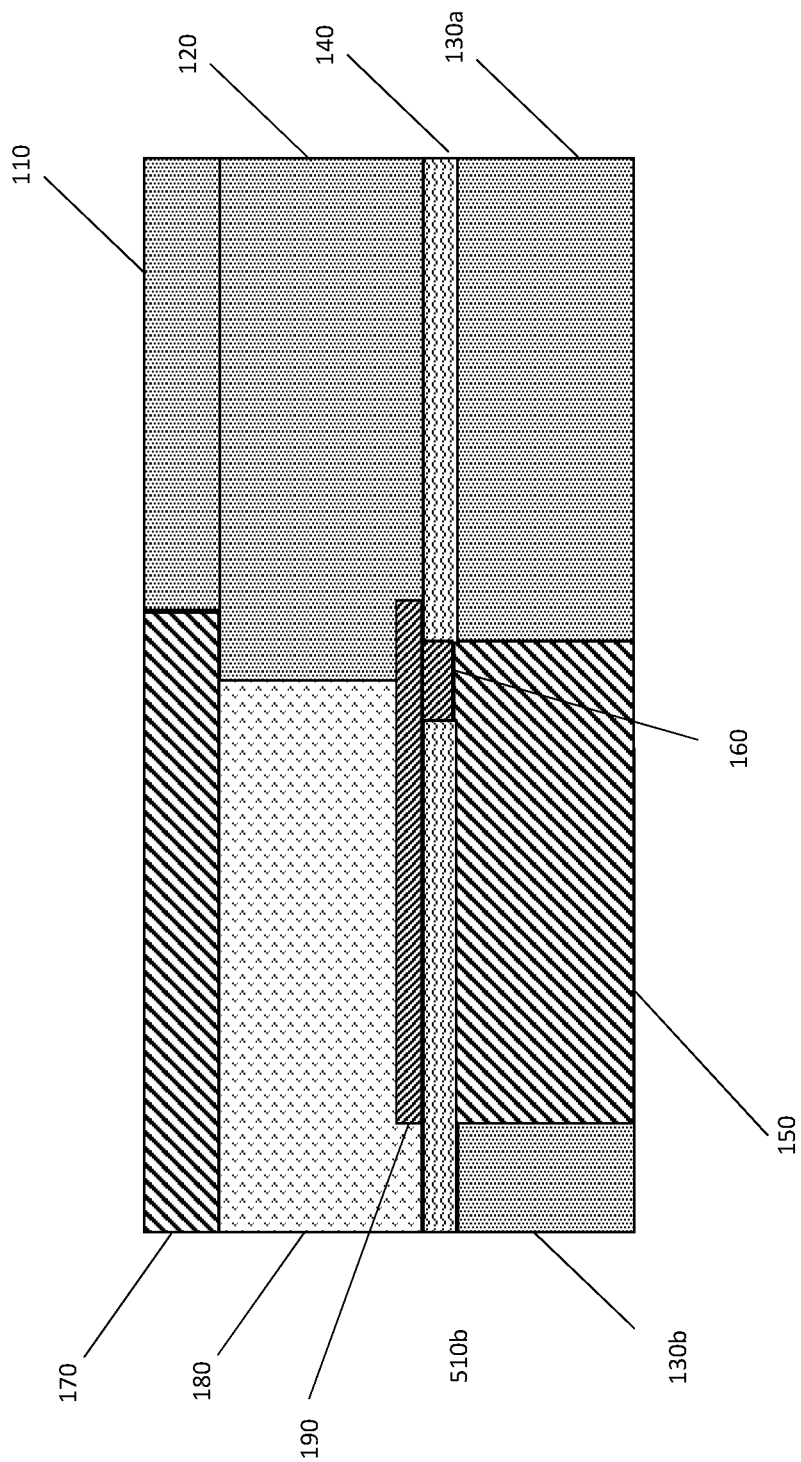
FIG. 11 illustrates an eighth stage of creating the PCM according to embodiments of the invention.

FIG. 11 illustrates an eighth stage of creating the PCM device according to embodiments of the invention. An insulator 110 is deposited on top of the PCM region 180 and the insulator 120. A trench is patterned to define a top electrode location. The top electrode material is deposited in the trench, and the top electrode material and insulator 110 are polished back by CMP to define top electrode 170.

Figure 12:
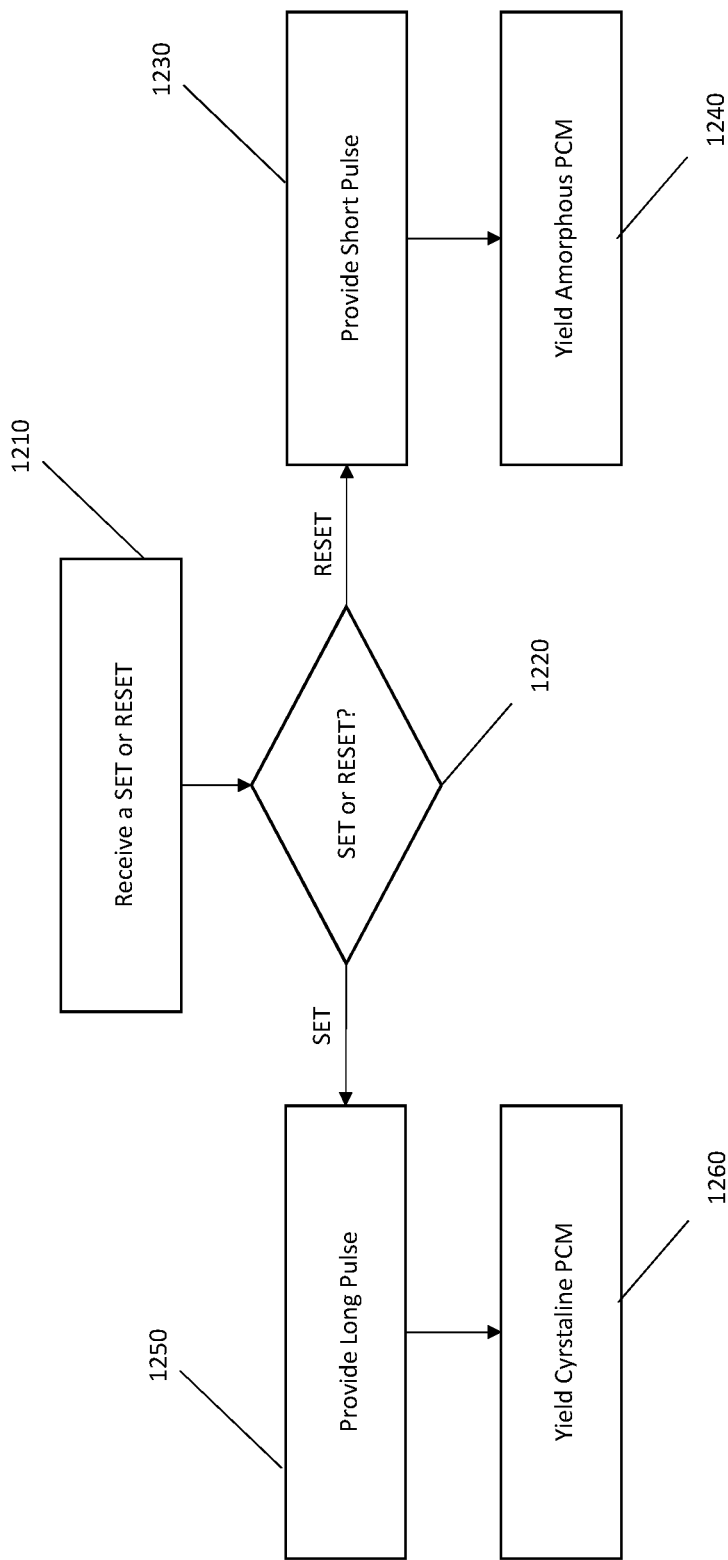
FIG. 12 illustrates a flowchart of an exemplary method of controlling the resistance of a PCM device according to embodiments of the invention.

FIG. 12 illustrates a flowchart of an exemplary method of controlling the resistance of a PCM device according to embodiments of the invention. A SET or RESET command is received by an access device (stage 1210). It is determined whether the received command is a SET or RESET command (stage 1220). If it is a RESET command, a short pulse is applied by the access device across a resistive electrode and a top electrode (stage 1230). The short pulse can be about 20, 30, or 40 ns, for example. The short pulse generates amorphous PCM at the point of highest voltage across a PCM region (stage 1240). If it is a SET command, a long pulse, typically about a hundred nanoseconds, is applied by the access device across the resistive electrode and the top electrode (stage 1250). The long pulse changes amorphous PCM to crystalline PCM (stage 1260).

Figure 13:
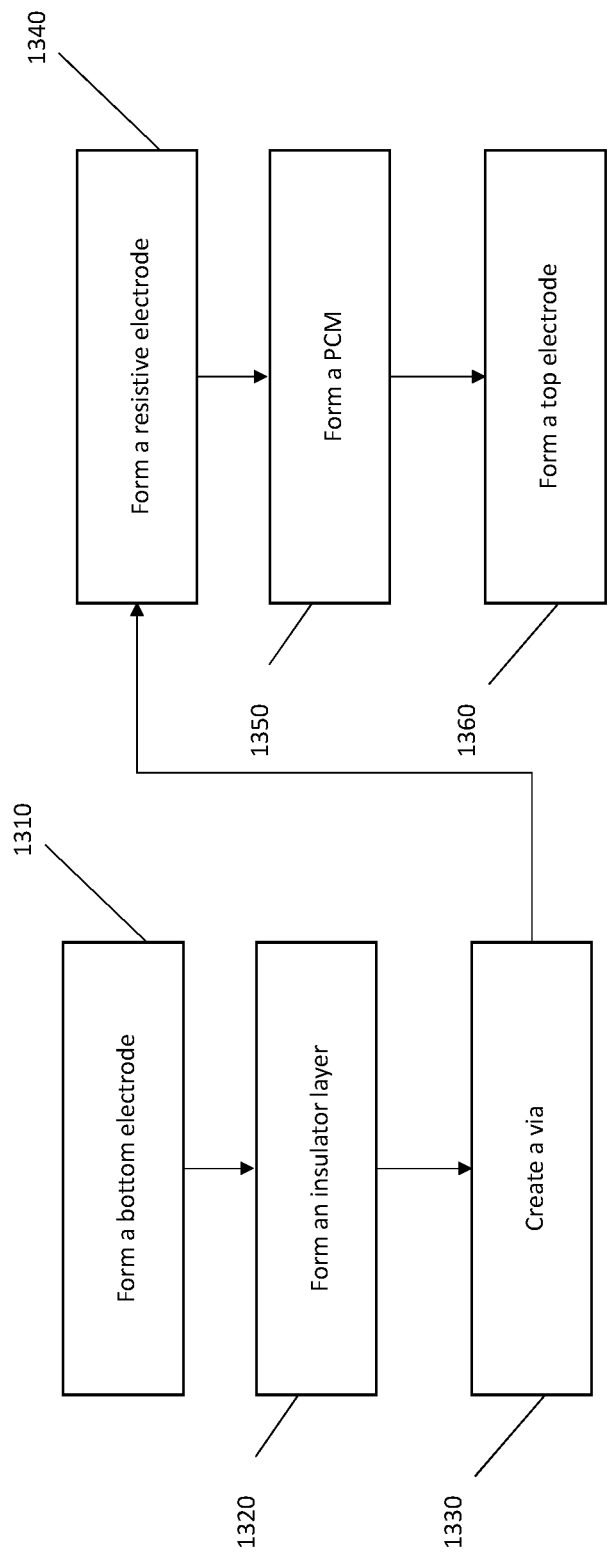
FIG. 13 illustrates a flowchart of an exemplary method of forming a PCM device according to embodiments of the invention.

FIG. 13 illustrates a flowchart of an exemplary method of forming a PCM device according to embodiments of the invention. First a bottom electrode is form on a silicon wafer (stage 1310). The bottom electrode can be formed by depositing an oxide layer and etching a trench in the oxide layer. The trench is filled with a metal to form a bottom electrode. Next, an insulator layer is formed over the bottom electrode (stage 1320).

Then, a via is created in the insulator layer over one end of the bottom electrode, with the via in electrical communication with the bottom electrode (stage 1330). The via is created by: depositing a layer of sacrificial material over the insulator layer; patterning the sacrificial material using lithography and RIE to create an opening; depositing a conformal layer across the sacrificial material and in the opening; etching, using RIE, the conformal layer to create spacers in the opening; etching back the exposed insulator layer; and depositing a via into the opening above the bottom electrode.

A resistive electrode is formed over the via (stage 1340). A PCM region is formed on the resistive electrode (stage 1350). The PCM region is formed by: depositing an insulator upon the insulator layer and the resistive electrode; patterning a trench in the insulator; and depositing PCM in the trench. Then, the PCM region and insulator are polished back by CMP.

Then, a top electrode is formed on top of the PCM (stage 1360). The top electrode is formed by depositing an insulator on top of the PCM region and the insulator; patterning a trench above the PCM region; and depositing top electrode material in the trench. Finally, the top electrode material and insulator are etched back to define the top electrode.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method of tuning a phase change materials ("PCM") device, the method comprising:
   receiving, by an access device, a command; and
   based at least in part on a determination that the command is a RESET command, providing a short pulse from the access device across a resistive electrode of the PCM device and a top electrode of the PCM device through a PCM region of the PCM device generating amorphous PCM at the point of highest voltage in a first region across the PCM region, wherein the short pulse is about 30 nanoseconds, wherein the resistive electrode contacts a bottom electrode through a via in an insulating layer between the resistive electrode and the bottom electrode;

providing a second short pulse from the access device across the resistive electrode of the PCM device and the top electrode of the PCM device through the PCM region of the PCM device generating amorphous PCM through a second region across the PCM region, wherein the second region extends further through the PCM region than the first region.

2. The method of claim 1, wherein the short pulse is provided to the resistive electrode via a via beneath one side of the resistive electrode.

3. The method of claim 1 wherein the PCM device comprises an amorphous region above the resistive electrode above the via within the PCM region.

4. The method of claim 1, further comprising forming an amorphous region across the length of the resistive electrode within the PCM region.

5. The method of claim 1, wherein each RESET pulse increases the area of the resistive electrode covered by amorphous PCM.

6. The method of claim 1, further comprising determining, using an access device, that the command is a SET command and when the command is a SET command, providing a long pulse across the resistive electrode and the top electrode through a PCM region.

7. The method of claim 1, further comprising determining, using an access device, that the command is a RESET command and when the command is a RESET command, providing a short pulse across the resistive electrode and the top electrode through a PCM region.

8. A method of tuning a phase change materials ("PCM") device, the method comprising:

receiving, by an access device, a command; and based at least in part on a determination that the command is a RESET command, providing a short pulse from the access device across a resistive electrode of the PCM device and a top electrode of the PCM device through a PCM region of the PCM device generating amorphous PCM at the point of highest voltage in a first region across the PCM region, wherein the short pulse is provided to the resistive electrode via a via beneath one side of the resistive electrode, wherein the short pulse is about 30 nanoseconds, wherein the resistive electrode contacts the bottom electrode through the via in an insulating layer between the resistive electrode and the bottom electrode;

providing a second short pulse from the access device across the resistive electrode of the PCM device and the top electrode of the PCM device through the PCM region of the PCM device generating amorphous PCM through a second region across the PCM region, wherein the second region extends further through the PCM region than the first region.

9. The method of claim 8 wherein the PCM device comprises an amorphous region above the resistive electrode above the via within the PCM region.

10. The method of claim 8, further comprising forming an amorphous region across the length of the resistive electrode within the PCM region.

11. The method of claim 8, wherein each RESET pulse increases the area of the resistive electrode covered by amorphous PCM.

12. The method of claim 8, further comprising determining, using an access device, that the command is a SET command and when the command is a SET command, providing a long pulse across the resistive electrode and the top electrode through a PCM region.

* * * * *